United States Patent
Kim et al.

(10) Patent No.: US 7,384,818 B2
(45) Date of Patent: Jun. 10, 2008

(54) ELECTRONIC PACKAGE FOR IMAGE SENSOR, AND THE PACKAGING METHOD THEREOF

(75) Inventors: Deok-Hoon Kim, Suweon (KR); Hwan-Chul Lee, Incheon (KR)

(73) Assignee: Optopac, Inc., Seoul (KR)

( * ) Notice: Subject to any disclaimer, the term of this patent is extended or adjusted under 35 U.S.C. 154(b) by 51 days.

(21) Appl. No.: 11/585,152

(22) Filed: Oct. 24, 2006

(65) Prior Publication Data

US 2007/0042530 A1    Feb. 22, 2007

Related U.S. Application Data

(62) Division of application No. 11/052,864, filed on Feb. 9, 2005, now Pat. No. 7,141,869.

(30) Foreign Application Priority Data

Nov. 8, 2004   (KR) .................... 10-2004-0090584

(51) Int. Cl.
*H01L 21/50* (2006.01)
(52) U.S. Cl. ................ 438/108; 257/E21.509
(58) Field of Classification Search ........ 257/E21.499, 257/E21.508, E21.509, E21.511
See application file for complete search history.

(56) References Cited

U.S. PATENT DOCUMENTS

| | | | | |
|---|---|---|---|---|
| 6,297,072 B1 * | 10/2001 | Tilmans et al. | ............. | 438/106 |
| 6,600,217 B2 * | 7/2003 | Onodera et al. | ............ | 257/667 |
| 7,259,032 B2 * | 8/2007 | Murata et al. | ................ | 438/26 |
| 2003/0210531 A1 * | 11/2003 | Alcoe et al. | ................ | 361/728 |

* cited by examiner

*Primary Examiner*—Scott B. Geyer
(74) *Attorney, Agent, or Firm*—Rosenberg, Klein & Lee

(57) ABSTRACT

A semiconductor device package and method for its fabrication are provided. The semiconductor device package generally includes at least one semiconductor die and a substrate coupled to the semiconductor die. The semiconductor die is provided with a front side defining a sealing area, and a first solder sealing ring pad formed on that front side. The substrate is provided with a front surface opposing the front side of the semiconductor die on which a second solder sealing ring pad is formed. A solder sealing ring structure is sandwiched between the first and second solder sealing pads of the substrate and semiconductor die, such that it extends peripherally about a substantial portion of the sealing area to substantially enclose thereat a cavity between the semiconductor die and the substrate. The solder sealing ring structure includes at least one venting portion defining against at least one of the substrate and semiconductor die an air vent in open communication with the cavity.

5 Claims, 14 Drawing Sheets

ELECTRONIC PACKAGE FOR IMAGE SENSOR, AND THE PACKAGING METHOD THEREOF

RELATED APPLICATION DATA

This Application is a Divisional Patent Application of application Ser. No. 11/052,864, filed on 9 Feb. 2005 now U.S. Pat. 7,141,869.

BACKGROUND OF THE INVENTION

1. Field of the Invention

The present invention relates generally to electronic packaging of semiconductor integrated circuits. More specifically, the present invention relates to electronic packaging of image-sensing semiconductor devices.

2. Related Art

Image sensors (or image-sensing semiconductor devices) find wide use in various digital photography applications. They are used in digital cameras and camcorder, for which the market has grown sharply since about 1999 when manufacturers began incorporating in cellular phone devices.

As shown in FIG. 1, an image sensor die 2 includes an image-sensing area 4 (the so-called "pixel area") at its center, and electrical terminals 6 (the so-called "bonding pads") about its peripheral areas for electrical input and output. Typically, the image-sensing area 4 includes a plurality of photo-diodes disposed underneath which serve to transduce light to electrical signals. Red, green, and blue color filters are disposed over the photo-diodes for differentiating the color of the incoming light. Micro-lenses are in turn disposed over the color filters for improving light intensity passing on to the photo-diodes. In the image sensor die configuration schematically illustrated in FIG. 1, only the image sensing area 4 and terminals 6 are shown for brevity and clarity.

Generally, semiconductor devices have been packaged in the so-called "plastic package," having epoxy molding compound fully enclosing the device for protection. In the case of image sensors, however, light must pass to the image-sensing area. Therefore, such plastic package is generally not suitable as electronic packaging for image sensors.

Ceramic packages having glass lid tops have been used for image sensor packaging. On such package is illustrated in schematic cross-section in FIG. 2. As shown in the figure, this ceramic package 10 includes a multi-layered ceramic substrate 14 and an image sensor chip 12 attached at a central portion of the substrate using epoxy or the like. Gold wires electrically connect the image sensor chip and substrate. A glass lid 16 is attached at a top of the package to allow the passage of light into the image sensor chip's image-sensing area.

This ceramic package has superior robustness. However, it is ordinarily very expensive. Moreover, the package in most cases is not small enough for hand-held applications like cellular phones. Because of these factors, use of such ceramic package is seen primarily in applications where high reliability is of greater concern than compact size or low price, such as digital camera or camcorder applications. Use of the package is not often seen in applications like camera phones, where low price and compact size are more important concerns than reliability.

Although not separately shown, a plastic package is also known in the art which incorporates typical lead frame and molding compound features, but includes a glass lid top to serve as an image sensor package, employing a plastic leadless chip carrier (PLCC) configuration. Such a package structure is well known to persons versed in image sensor packaging art. A notable advantage is that it tends to be less in cost than the ceramic package. However, it is not as robust as the ceramic package, and is no more compact than a comparable ceramic package. For these reasons, such plastic package structure has been used primarily in certain PC camera applications where low price is the most important of requirements, over such others as reliability or size.

Another packaging option proposed in the art for an image sensor is one having a laminate substrate instead of ceramic, but with much the same configuration as a ceramic package. This option may prove a bit cheaper in cost, but also fails to provide the degree of compactness normally required for hand-held applications. A figure schematic illustrating this package is omitted for brevity and clarity, as such package structure is well known to persons versed in image sensor packaging art.

The packages mentioned above fail to provide sufficient compactness for hand-held applications such as cellular phone. Chip scale (or size) packaging (CSP) technology for image sensors having low price and small size has drawn much interest in the art for hand-held applications, given the enormous recent growth of the market.

CSP technology suitable for image sensor was proposed by Shellcase Inc. Detailed techniques relating to this technology are disclosed in U.S. Pat. Nos. 5,716,759, 6,040,235, and 6,117,707, for example. FIG. 3 illustrates a schematic cross-section of a package formed according to this technology. For better understanding of the advantages and disadvantages of the package, it is helpful to explain the method for forming the structure. First, an image sensor wafer is provided with bonding pads extended to its dicing areas which have narrow widths between neighboring dice. The dicing width must be sufficiently wider than the approximate 100 micro-meters normally used in the semiconductor industry. This special requirement limits the package's application in practice.

To form a package 20 shown in FIG. 3 according to this technique, a front side of an image sensor wafer 22 is attached to a glass wafer 24 using epoxy 21 or the like. Then, a backside of the image sensor wafer is thinned by grinding. Generally, the wafer thickness before thinning is about 725 micro-meters, and about 100 micro-meters after it is thinned. A detailed explanation as to the need for such thinning is omitted herein for brevity and clarity.

Afterwards, another glass wafer is attached to the backside of the image sensor wafer by using epoxy or the like. Then the wafer is partially diced up to sufficient depth that the terminals extending to the dicing line are exposed. Special dicing blades having a certain tip angle is used for this operation to form a ditch-like structure where terminals are exposed at inner surfaces of the ditch. Interconnection metal lines are thereafter formed over the surface by metal layer depositing and patterning. Additional description of further processing steps necessary to complete this package are omitted for brevity and clarity.

A most important advantage of this technique is that the resulting package size is about the same as the image sensor die size. However, there are several critical drawbacks in this technique. The most critical drawback is that the structure is too complicated, and the process technique is too difficult. Detailed explanations are again omitted for brevity and clarity, but such drawbacks are well known to persons versed in the wafer level packaging art. Because of these drawbacks, required manufacturing costs tend to be prohibitively high, and sufficiently high yields tend to be difficult to achieve, which in turn also increases overall manufacturing costs.

Other drawbacks are found with this technique. One of them is that the image sensor wafer has to meet certain special requirements, like terminals having to be extended to the dicing area and the pertinent width having to be substantially larger than normal as a result. This tends to decrease the total number of dice realizable on a given wafer, given the need for wider dicing lines. In practice, an image sensor maker employing this technique is forced to produce multiple wafer types, one adapted for this packaging technique, and another of more conventional configuration for other general packaging techniques. This results in additional costs.

Yet another disadvantage to this technique is that all dice on wafers are subjected to all the manufacturing processes in this technique. The manufacturing cost depends quite heavily on the yield of each image sensor wafer in this kind of situation. In the example of one device having an 80% image sensor wafer yield and another having a 40% yield, the unit package manufacturing cost (or price) in the latter case would be double that in the former case. The reality presently is that even matured image sensor devices in production have typically about a 70% yield; and, image sensor makers typically start mass production at about a 30% yield. With high resolution image sensors, the wafer yield could be even lower than 30% in production, since wafer yield is inversely related to resolution. Given such circumstances, it is not easy to adopt this technique for packaging an image sensor wafer. The technique is not used much for these reasons, even though it provides superior compact package size advantages.

A major source of failure in image sensor packaging is particles adhered to image sensing area surfaces. This causes repeatable spotting in the resultant digital images. Even though particles may not actually stick to image sensing area surfaces, but instead moves inside of the package, the persistent if not repeatable spotting which results in the resultant digital images is equally unacceptable. Contamination of the image sensing area otherwise may cause the same kind of failure. Therefore, it is critical in image sensor packaging to minimize or prevent any particle entry or other contamination, especially at the image sensing area. That is why higher cleanness is particularly essential in image sensor packaging than in other types of packaging.

Image sensor packages typically include a sealing structure for preventing particles from reaching and entering the image sensing area. For instance, a ceramic package for image sensor includes a glass lid on top of the package, with a cavity formed inside, such that particles are prevented from getting inside once the glass lid is placed and attached onto the package.

Humidity uptake inside the image sensing area is also known to degrade a color filter and micro-lens disposed thereon. This does not appear to be a significant issue with many digital cameras, but in the case of high-end, professional-grade digital cameras, for instance, hermetic or other protective measures have been sought to prevent or minimize the humidity uptake.

A package having a hermetic metal sealing structure was proposed by IMEC, VZW. Detailed techniques relating to such structure are disclosed in U.S. Pat. No. 6,566,745. FIGS. 4a and 4b illustrate the package structure. As shown in the figures, this package 30 includes flip chip solder joints 33 for electrical interconnection between an image sensor die 32 and a glass substrate 31. Also, this package includes solder balls 34 which serve as package's external terminals, as well as metal lines 37 formed on the glass substrate for connecting the solder balls and flip chip solder joints. This package further includes a solder sealing ring 35 having a closed loop configuration. In addition, the package includes epoxy sealing 36 disposed about the solder sealing ring. Other components are not shown, in the interests of brevity and clarity.

The metal sealing structure provides a hermetic seal for preventing particle or humidity uptake, while epoxy sealing structure provides a non-hermetic seal inasmuch as that it permits some amount of humidity to get inside by diffusion.

This IMEC, VZW package strives for the most ideal sealing structure for image sensors, but substantial difficulties must be overcome in actually forming the structure. First of all, this package requires a vacuum solder reflow process instead of a conventional convection reflow process or the like. Normally, a flip chip die collapses when solder bumps melt and wet to pads of the substrate during a solder reflow process. That is, the height of a flip chip solder joint formed by a solder reflow process is substantially less than that of the original flip chip solder bump. Solder bumps 50 micrometers in height, for example, typically form solder joints approximately just 30 micro-meters high. The amount of collapse mainly depends on the pad size on substrate. For instance, if the pad size were infinite, the collapse would be 100%, and the solder joint height would conversely be zero. On the other hand, if the pad size were to approach zero, the amount of collapse would also approach zero, and the solder joint height will remain the same as the solder bump height. While further explanation is omitted, this is well known to persons versed in the soldering art.

The IMEC, VZW package includes a solder sealing ring structure having a closed loop configuration. As the solder material melts and wets to pads on the substrate, the solder sealing ring necessarily tends toward some collapse. If not done within a vacuum environment, the air entrapped within the cavity surrounded by the ring would hinder this collapse of not only the solder sealing ring but also the flip chip bumps. This would increase failure rate in forming solder joints, which in turn increases yield loss. Therefore, vacuum solder reflow or the like is essential for properly forming this structure.

A fluxless soldering technique is also essential for properly forming this structure. Normally, flux is applied onto joining areas of objects to be adjoined by soldering. Flux removes oxide from surface of joining objects and also prevents oxidation during a solder reflow process. It includes a solvent that evaporates early in the reflow process, at about 60°-100° C. depending on the given flux material characteristics. This is called "out-gassing." In the IMEC, VZW package structure, there is no path by which the solvent can evacuate since a closed cavity is maintained. Residual solvent in the cavity would prove detrimental to long term reliability, and may also cause contamination of the image sensing area. Therefore, the IMEC, VZW package structure necessitates a fluxless soldering technique to properly form its sealing structure.

Conventional solder reflow techniques, like the so-called surface mounting technique (SMT), is quite inexpensive and reliable. This technique includes flux application on joining areas, and permits the transport of objects to be adjoined through a belt (conveyor) oven. A vacuum reflow technique, on the other hand, is not common in industry even though it has been tried for research purposes. Hence, there is no vacuum reflow equipment for mass production commercially available presently on the market.

A vacuum reflow oven would not necessarily be difficult to build. A possible configuration of the equipment may include a vacuum chamber and a robot system to handle wafer transport in and out. Also the equipment may include infrared (IR) lamps to heat the wafer through a glass window of the vacuum chamber. The temperature control would not be as simple as for a conventional belt oven. The equipment price, however, would be considerably higher than that for a conventional belt oven. The throughput would be much lower considering that processing of the next wafer must await complete processing of the wafer then in the vacuum chamber, whereas wafers may be continually transported for processing through a conventional belt oven.

The required fluxless soldering for forming this package structure would add further costs and complexity. Detailed explanation in that regard is omitted, however, for brevity and clarity.

SUMMARY OF THE INVENTION

Accordingly, it is an object of the present invention to provide a simple and conveniently employed, and highly cost-effective sealing technique for image sensor packaging.

It is another object of the present invention to provide a sealing technique which utilizes readily available and mature aspects of soldering infrastructure.

It is yet another object of the present invention to provide a sealing technique which exceeds conventional epoxy sealing techniques in impermeability and closely approaches that of hermetic sealing techniques.

These and other objects are attained by a semiconductor device package formed in accordance with various embodiments of the present invention. The semiconductor device package generally comprises in one embodiment at least one semiconductor die and a substrate coupled to the semiconductor die. The semiconductor die includes a front side defining a sealing area, and a first solder sealing ring pad formed on that front side. The substrate includes a front surface opposing the front side of the semiconductor die, and a second solder sealing ring pad formed on that front surface. The device package also comprises a solder sealing ring structure sandwiched between the first and second solder sealing pads of the substrate and semiconductor die, which extends peripherally about a substantial portion of the sealing area to substantially enclose thereat a cavity between the semiconductor die and the substrate. The solder sealing ring structure includes at least one venting portion defining against at least one of the substrate and semiconductor die an air vent in open communication with the cavity.

BRIEF DESCRIPTION OF THE DRAWINGS

FIG. 4b is a schematic plan view, partially cut away, of a corner portion of the electronic package illustrated in FIG. 4a;

FIG. 5b is a schematic plan view of an exemplary embodiment of a solder sealing ring structure employed in the electronic package embodiment illustrated in FIG. 5a;

FIG. 6b is a schematic plan view of an exemplary embodiment of a solder sealing ring structure employed in the electronic package embodiment illustrated in FIG. 6a;

FIG. 9b is a schematic plan view of the package embodiment illustrated in FIG. 9a;

FIG. 10a is a schematic plan view of an exemplary embodiment of a solder sealing ring pad formed on an image sensor die of the present invention;

FIG. 10b is a schematic plan view of an exemplary embodiment of a solder sealing ring pad formed on a substrate to correspond to the solder sealing ring pad embodiment of the image sensor illustrated in FIG. 10a;

FIG. 11b is a schematic plan view of another exemplary embodiment of a solder sealing ring pad formed on a substrate to correspond to the solder sealing ring pad embodiment of the image sensor illustrated in FIG. 11a;

FIG. 12b is a schematic plan view of yet another exemplary embodiment of a solder sealing ring pad formed on a substrate to correspond to the solder sealing ring pad embodiment of the image sensor illustrated in FIG. 12a;

FIG. 13b is a schematic plan view of still an exemplary embodiment, having a plurality of line elements, of a solder sealing ring pad formed on a substrate to correspond to the solder sealing ring pad embodiment of the image sensor illustrated in FIG. 13a;

FIG. 14b is a schematic plan view of another exemplary multi-line element embodiment of the solder sealing ring pad formed on a substrate to correspond to the solder sealing ring pad embodiment of the image sensor illustrated in FIG. 14a;

FIG. 15a is a schematic plan view of an exemplary embodiment of a solder sealing ring pad formed on an image sensor die of the present invention, similar to the embodiment shown in FIG. 10a;

FIG. 15b is a schematic plan view of an exemplary embodiment of a solder sealing ring pad formed on a substrate to correspond to the solder sealing ring pad embodiment of the image sensor illustrated in FIG. 15a;

FIG. 16b is a schematic plan view of another exemplary embodiment of a solder sealing ring pad formed on a substrate to correspond to the solder sealing ring pad embodiment of the image sensor illustrated in FIG. 16a;

FIG. 17b is a schematic plan view of still another exemplary embodiment of a solder sealing ring pad formed on a substrate to correspond to the solder sealing ring pad embodiment of the image sensor illustrated in FIG. 17a;

FIG. 18b is a schematic plan view of a further exemplary embodiment of a solder sealing ring pad formed on a substrate to correspond to the solder sealing ring pad embodiment of the image sensor illustrated in FIG. 18a;

DETAILED DESCRIPTION OF THE PREFERRED EMBODIMENTS

Figure 5A:
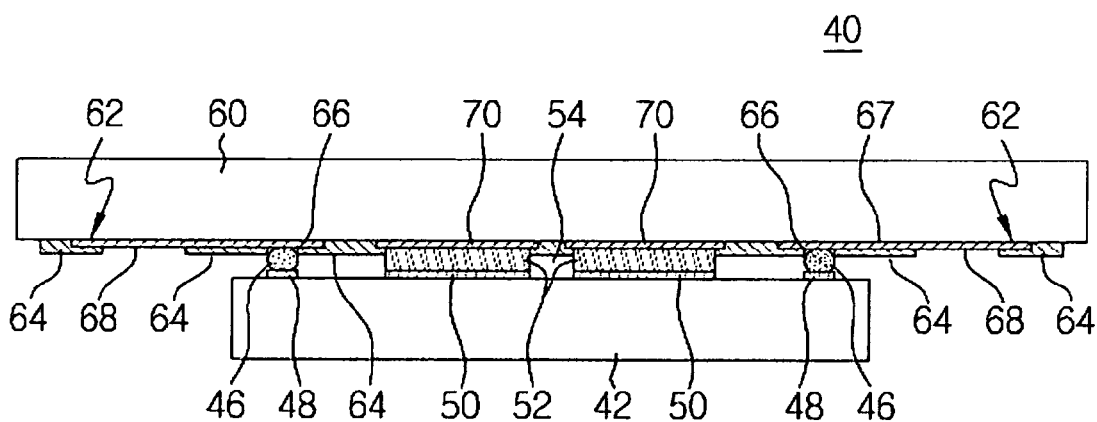
FIG. 5a is a schematic cross-sectional view of an exemplary embodiment of the electronic package of the present invention.
Figure 5B:
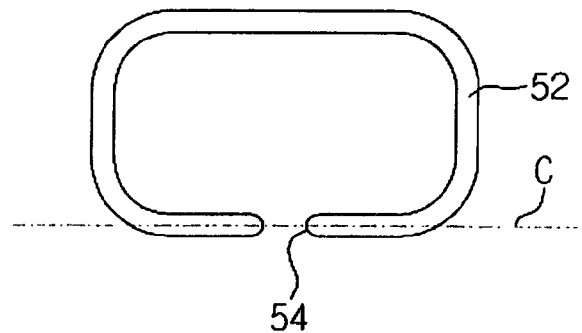

An electronic package 40 formed in accordance with one exemplary embodiment of the present invention, is schematically illustrated in FIGS. 5a and 5b. The package 40 includes an image sensor die 42, which is formed with at least one image sensing area 44. The image sensor die 42 includes electrical terminals, preferably in the form of so called "bonding pads" about a peripheral area thereof. The image sensor die 42 further includes solder bump pads 48 that are electrically connected to the bonding pads. The image sensor die 42 also includes a solder sealing ring pad(s) 50 formed substantially about the image sensing area.

The electronic package 40 of the present invention, as shown in FIGS. 5a and 5b, additionally includes a substrate 60. The substrate 60 is formed of a material having substantial transparency in the range of wavelengths of light that the image sensor detects. The substrate is provided with at least one patterned metal layer 62 and at least one patterned passivation layer 64. The patterned metal and passivation layers define solder bump pads 66 which correspond to the solder bump pads 48 of the image sensor die.

The patterned metal and passivation layers also define external electrical terminals 68 for the electronic package. In addition, the patterned metal and passivation layers define solder sealing ring pad(s) 70 which correspond to the solder sealing ring pad(s) 50 of the image sensor die.

The electronic package 40 formed in accordance with the present invention as shown in FIGS. 5a and 5b also includes flip chip solder joints 46 connecting the solder bump pads of the image sensor die 42 and substrate 60. The electronic package 40 further includes a solder sealing ring structure 52 extending between to connect the opposed solder sealing ring pads 50, 70 of image sensor die 42 and substrate 60. The solder sealing ring structure 52 is formed with an air vent 54, and disposed preferably outside of the die's image sensing area to extend thereabout.

Figure 6A:
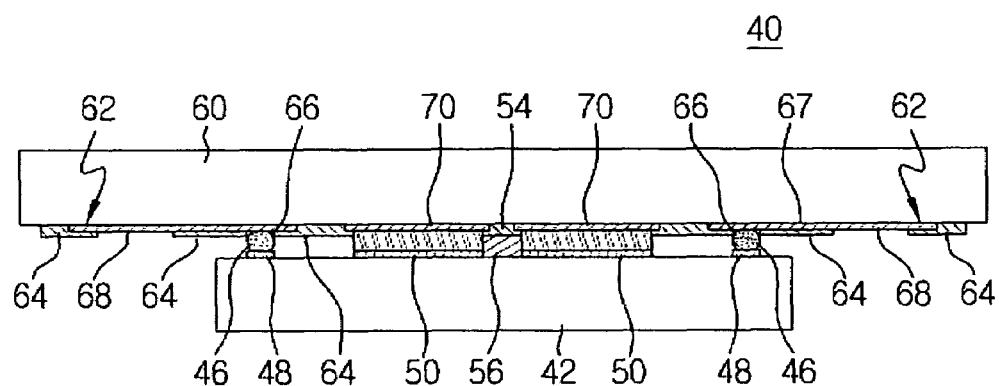
FIG. 6a is a schematic cross-sectional view of another exemplary embodiment of the electronic package of the present invention.
Figure 6B:
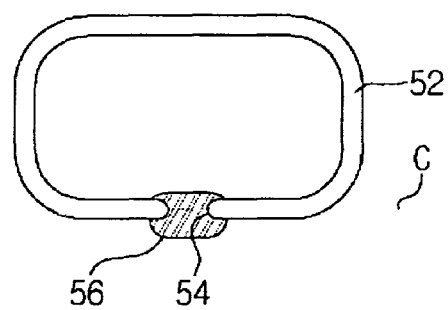
Figure 7:
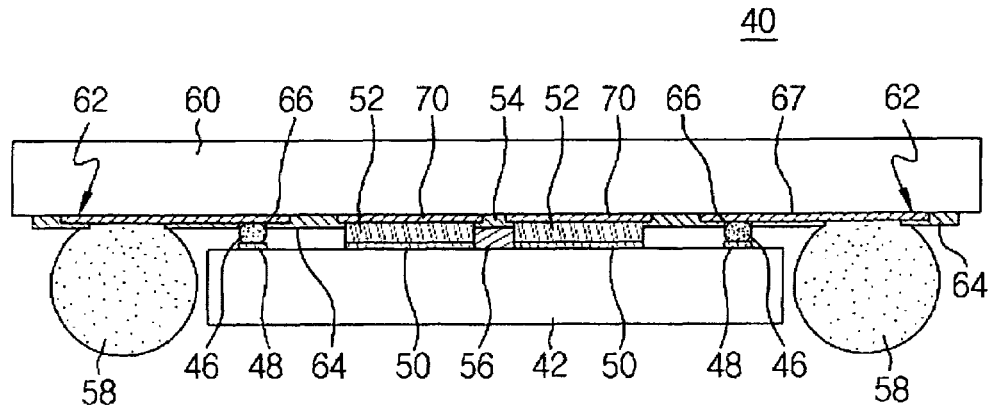
FIG. 7 is a schematic cross-sectional view of yet another exemplary embodiment of the electronic package of the present invention.
Figure 8:
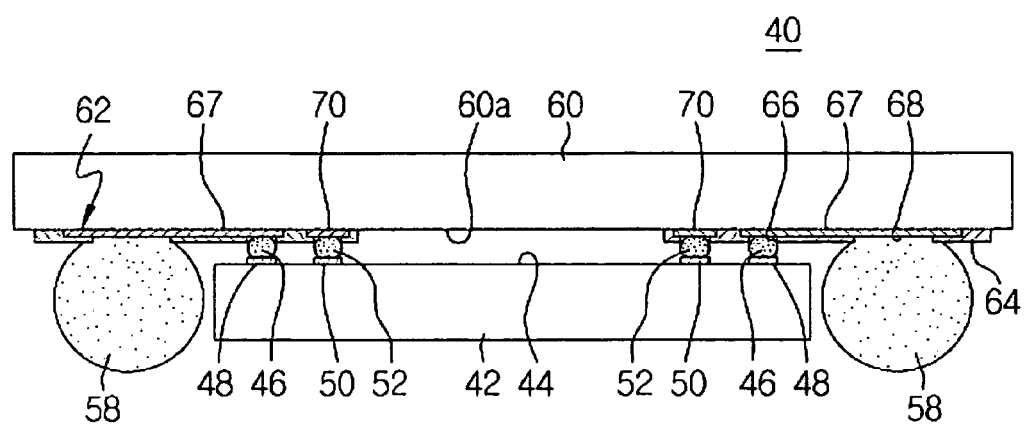
FIG. 8 is a schematic cross-sectional view of the electronic package embodiment illustrated in FIG. 6a, as viewed from a transversely offset perspective.

The electronic package 40 may in certain embodiments further include an optical coating layer(s) on at least one side of the substrate for increasing or decreasing (filtering) certain wavelength components of the received light. The electronic package 40 may also include in certain embodiments a polymer sealing structure 56 formed at or about the air vent 54, as shown in FIGS. 6a and 6b. Also, the electronic package 40 may in certain embodiments include solder balls 58 connected at its external terminals, as shown in FIGS. 7 and 8.

Figure 9A:
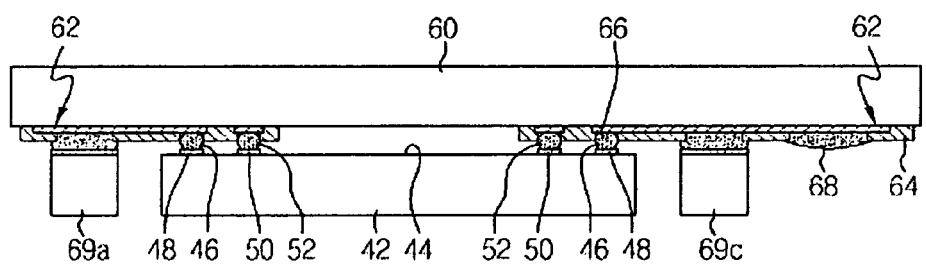
FIG. 9a is a schematic cross-sectional view of another exemplary embodiment of the package of the present invention, as applied to an overall package type different from that of the packages illustrated in FIG. 6a-8.
Figure 9B:
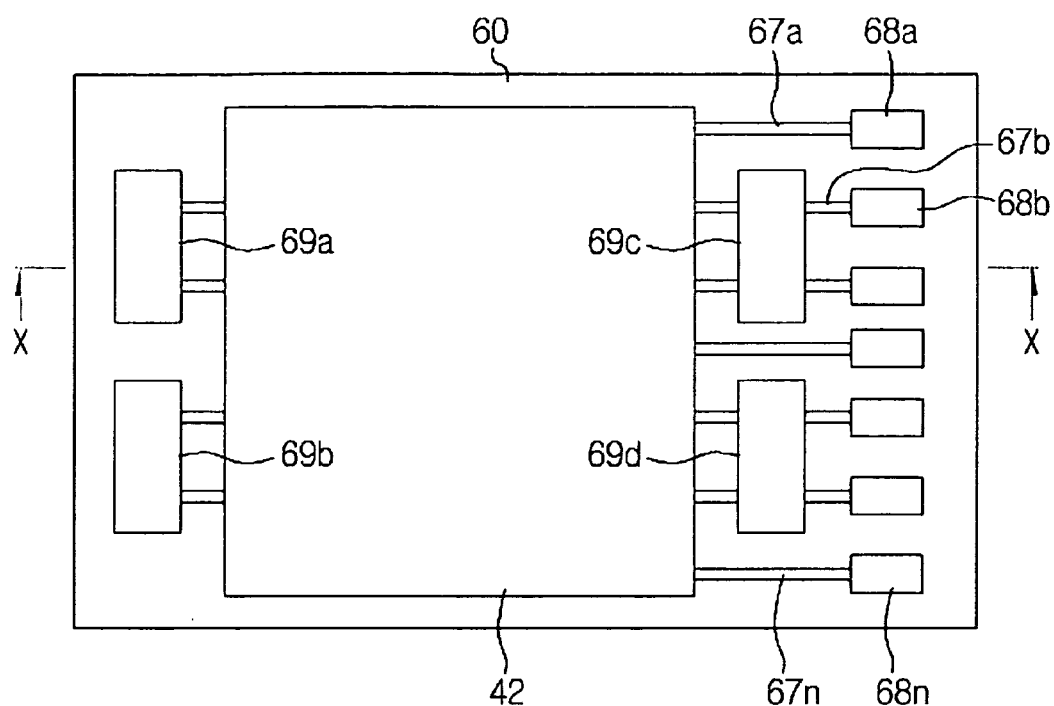

FIGS. 9a and 9b show another possible configuration of the electronic package in accordance with another exemplary embodiment of the present invention. This package incorporates other semiconductor chip devices such as decoupling capacitance devices.

Figures 10A, 10B:
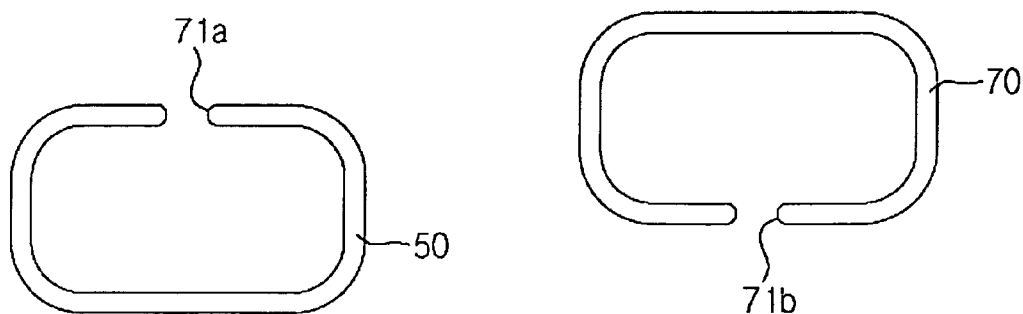

FIGS. 10a and 10b show corresponding solder sealing ring pad structures 50, 70 respectively for the image sensor die 42 and substrate 60 shown in the exemplary embodiment of FIGS. 5a and 5b. The patterns of the two corresponding pad structures 50, 70 form substantial mirror images of one another because the pad structures are oriented to face each other when the package 40 is assembled. As shown in the figures, the solder sealing ring pads are formed with an open loop configuration such that upon assembly, an air vent is defined at the loop's opening. Preferably, the solder sealing ring pad is smoothly contoured to form a band having uniform width therealong, so that solder may spread uniformly during solder bumping and solder joining processes.

Figure 11A:
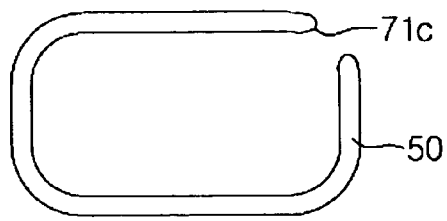
FIG. 11a is a schematic plan view of another exemplary embodiment of a solder sealing ring pad formed on an image sensor die of the present invention.
Figure 11B:
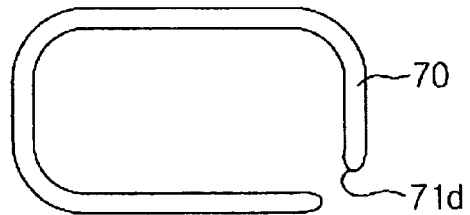

The configurations illustrated in FIGS. 10a and 10b result in a solder sealing ring structure having an air vent formed substantially at a center along one edge portion of the electronic package. FIGS. 11a and 11b alternatively show respective sealing ring pad configurations corresponding to a similar solder sealing ring structure, but with an air vent formed substantially at a corner portion of the electronic package. The air vent may be positioned at any suitable point along the solder sealing ring structure, depending on the specific requirements of the intended application.

Preferably though not necessarily, the widths of the solder sealing ring pads on the image sensor and substrate are each within the approximate range of 60-200 micrometers. The air vent length is suitably determined in light of this width for the solder sealing ring pads in the solder sealing ring structure (as shown in FIGS. 10a and 10b or 11a and 11b). The cross-sectional area of the air vent opening is accordingly determined by the lengths of the open portions of the solder sealing ring pads and the height of solder sealing ring resulting upon solder assembly. Preferably though not necessarily, the open portion of the solder sealing ring pad is within the approximate range of 20-500 micrometers in length, and the solder sealing ring after solder assembly is within the approximate range of 20-100 micrometers in height.

Figure 12A:
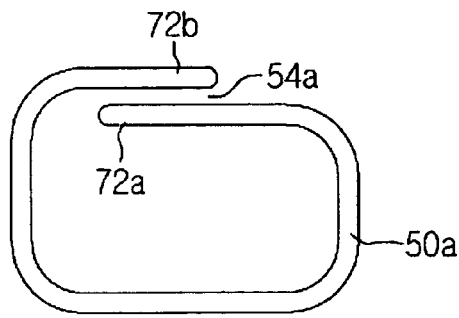
FIG. 12a is a schematic plan view of yet another exemplary embodiment of a solder sealing ring pad formed on an image sensor die of the present invention.
Figure 12B:
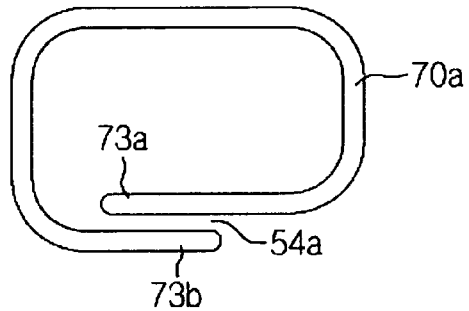

FIGS. 12a and 12b illustrate another exemplary embodiment, wherein the respective solder sealing ring pads 50a, 70a of the image sensor and substrate define a partially spiraled open loop configuration. The solder sealing ring pad patterns on the opposed surfaces of the image sensor die and substrate are formed as mirror images of one another, as explained above. The air vent 54 defined by these solder sealing ring pads 50a, 70a extends through the elongated corridor 54a resulting between the solder sealing pads' spaced overlapping end portions 72a, 72b and 73a, 73b. Such extended air vent length serves to further mitigate the likelihood of any particles actually entering the cavity surrounded by the resultant solder sealing ring structure. The cross-sectional area of the air vent is determined by the gap (corridor width) between the overlapping solder sealing ring pad parts and the height of the solder sealing ring structure upon assembly.

Preferably though not necessarily, the gap is within the approximate range of 20-80 micrometers, and the height is within the approximate range of 20-100 micrometers. While FIGS. 12a and 12b illustrate exemplary configurations wherein the inner end portions 72a, 73a would be disposed adjacent a corner region of the given electronic package and the outer end portions 72b, 73b would be disposed more centrally along a peripheral edge region of the electronic package, the respective locations of such end portions 72a, 72b and 73a, 73b may be suitably varied depending on the particular requirements of the intended application.

Figure 13A:
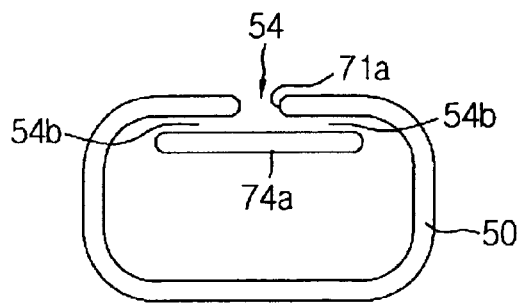
FIG. 13a is a schematic plan view of an exemplary embodiment, having a plurality of line elements, of a solder sealing ring pad formed on an image sensor die of the present invention.
Figure 13B:
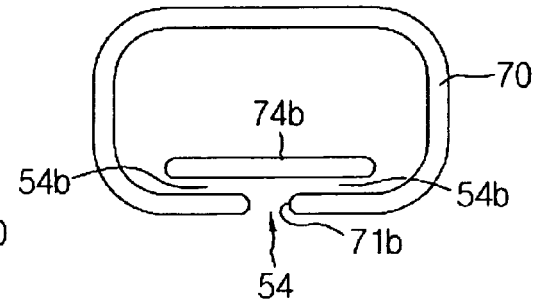

FIGS. 13a and 13b illustrate another configuration for the respective solder sealing ring pad structures of the image sensor die and substrate, in accordance with another alternate embodiment of the present invention. As shown, the solder sealing ring pad structure in this embodiment includes multiple line elements. Primary elements of the solder sealing ring pads 50, 70 are similar to the respective solder sealing ring pads in the embodiment of FIGS. 10a and 10b. Secondary line elements 74a, 74b are additionally disposed, however, each within its primary element's loop profile, positioned to block that primary element's open area (air vent) 54. The air vent defined by the resulting solder sealing ring structure then includes two paths passing through the corridors 54b formed between the overlapping portions of the spaced primary and secondary line elements 50, 70 and 74a, 74b.

Design considerations for the air vent 54 formed in accordance with this embodiment are similar to those pertaining to the preceding embodiment, as discussed above. The cross-sectional area of the air vent 54 may thus be determined in much the same manner as in the embodiment of FIGS. 12a and 12b, by accordingly setting the gap (corridor width) between the overlapping parts of solder sealing ring pad elements and the height of the solder sealing ring resulting upon assembly.

As shown, the entrance of air vent 54 from outside may be formed much as that of the solder sealing ring structure embodiment shown in FIGS. 10a and 10b are formed. The extended air vent length provided by virtue of the path extensions 54b serves as in the preceding embodiment to mitigate the likelihood of any particles ultimately entering the cavity surrounded by the resultant solder sealing ring structure.

Figure 14A:
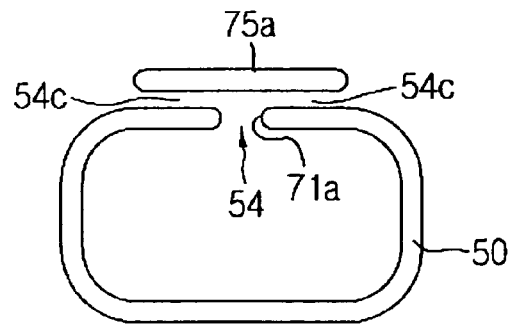
FIG. 14a is a schematic plan view of another exemplary multi-line element embodiment of the solder sealing ring pad formed on an image sensor die of the present invention.
Figure 14B:
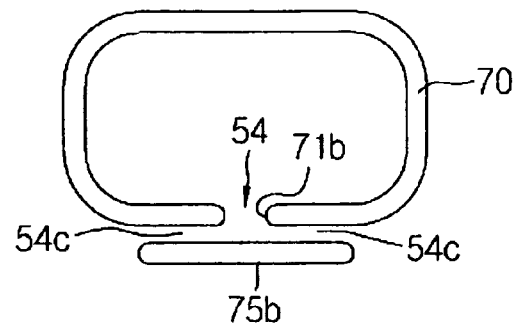

FIGS. 14a and 14b illustrate another embodiment of the solder sealing ring pad structures formed on the image sensor and substrate, respectively. The configuration in this embodiment is similar to that of the embodiment shown in FIGS. 13a and 13b, except that each additional line element 75a, 75b is located outside the loop profile of its primary element 50, 70 rather than inside.

Figure 15A:
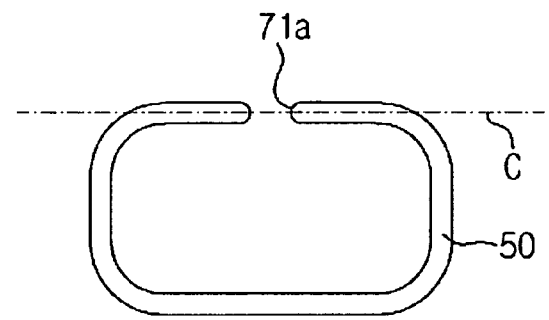
Figure 15B:
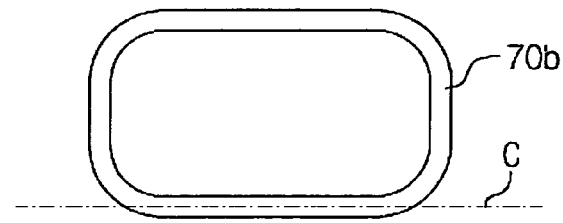

FIGS. 15a and 15b illustrate a configuration of the solder sealing ring pad structure formed respectively on the image sensor and substrate in accordance with yet another embodiment of the present invention. In this embodiment, one of the solder sealing ring pads, namely the solder sealing ring pad 70b formed on the substrate (in the example shown in FIG. 15b), is of a closed loop configuration, whereas the other solder sealing ring pad 50 (formed on the image sensor in the example shown in FIG. 15a) is of an open loop configuration, as in preceding embodiments. With this solder sealing ring pad configuration, molten solder is without immediate solder wettable pad support only at the open area of the image sensor's solder sealing ring pad 50, which forms a vent structure 54d (FIG. 15c).

Figure 15C:
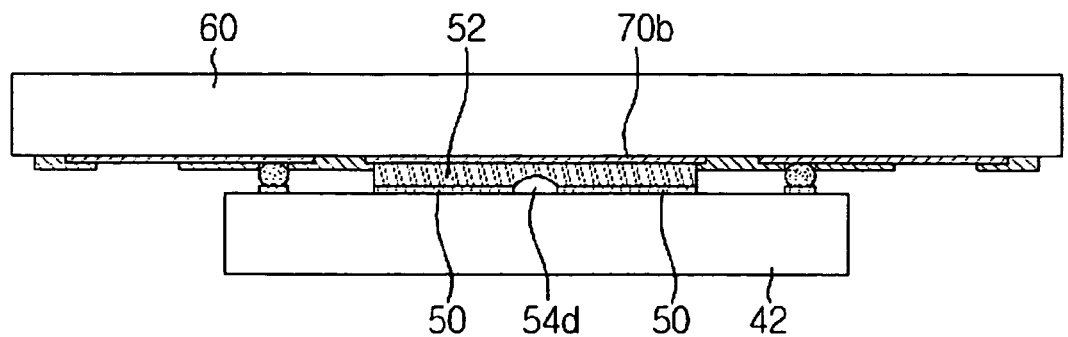
FIG. 15c is a schematic cross-sectional view of an electronic package embodiment of the present invention illustratively incorporating the solder sealing ring pad embodiments illustrated in FIGS. 15a and 15b.
Figure 16A:
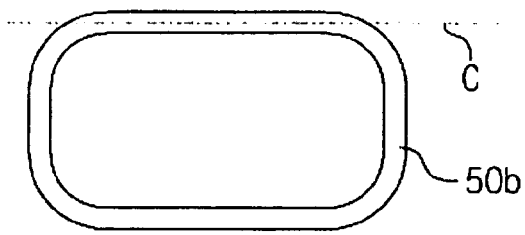
FIG. 16a is a schematic plan view of another exemplary embodiment of a solder sealing ring pad formed on an image sensor die of the present invention.
Figure 16B:
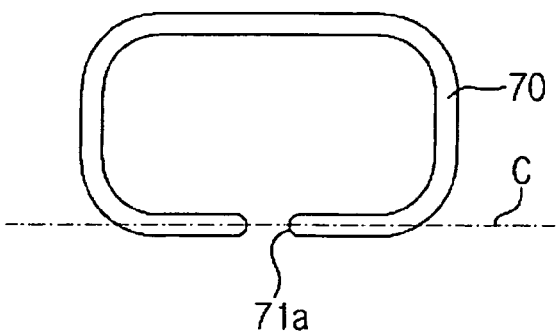
Figure 16C:
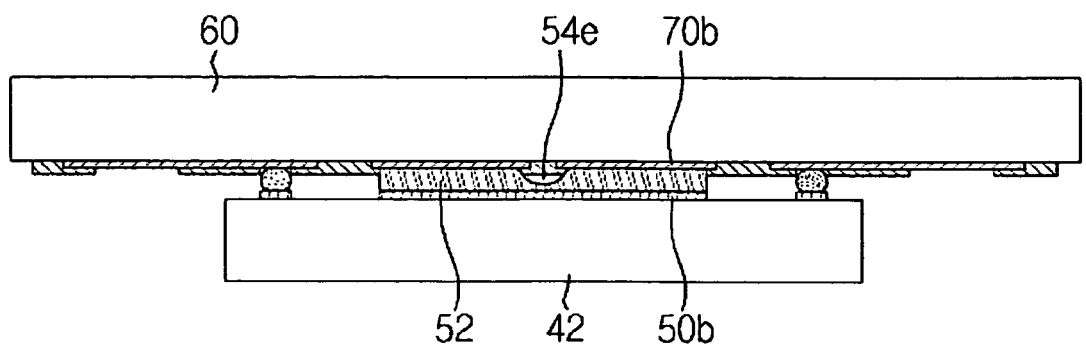
FIG. 16c is a schematic cross-sectional view of another electronic package embodiment of the present invention illustratively incorporating the solder sealing ring pad embodiments illustrated in FIGS. 16a and 16b.

The cross-sectional view of the resulting electronic package is depicted in FIG. 15c. A conversely configured electronic package embodiment is depicted in FIGS. 16a, 16b, and 16c. In this configuration, solder sealing ring pad 50b (formed on the image sensor in the example shown in FIG. 16a) is of a closed loop configuration, while the solder sealing ring pad 70 formed on the substrate (in the example shown in FIG. 16b), is of an open loop configuration, such that an air vent 54e is defined against the substrate, through the break in its solder sealing ring pad.

Figure 17A:
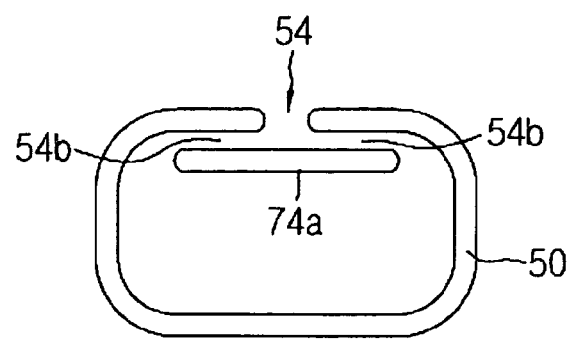
FIG. 17a is a schematic plan view of still another exemplary embodiment of a solder sealing ring pad formed on an image sensor die of the present invention.
Figure 17B:
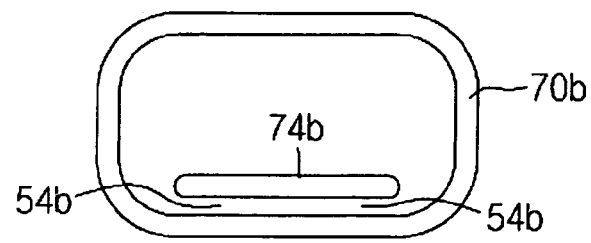

The air vent structures 54d, 54e shown in FIG. 15c or 16c may be slighter than that in other embodiments disclosed in preceding paragraphs. FIGS. 17a and 17b show another configuration of solder sealing structures respectively formed on the image sensor and substrate, in accordance with yet another exemplary embodiment of the present invention. The embodiment combines configurational features incorporated to form the air vent structures in the embodiments of FIGS. 13a and 13b, and FIGS. 15a, 15b, and 15c.

Figure 18A:
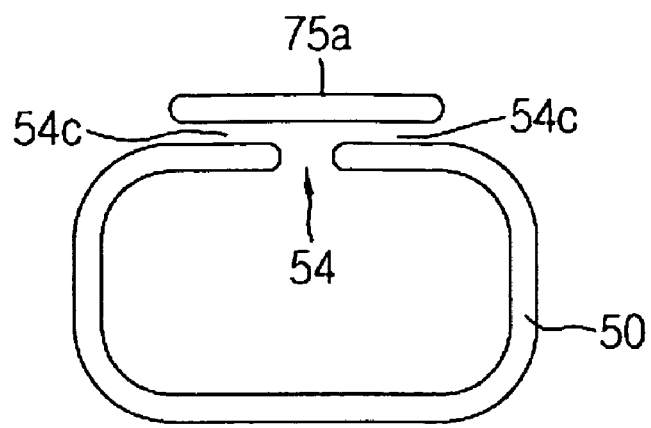
FIG. 18a is a schematic plan view of a further exemplary embodiment of a solder sealing ring pad formed on an image sensor die of the present invention.
Figure 18B:
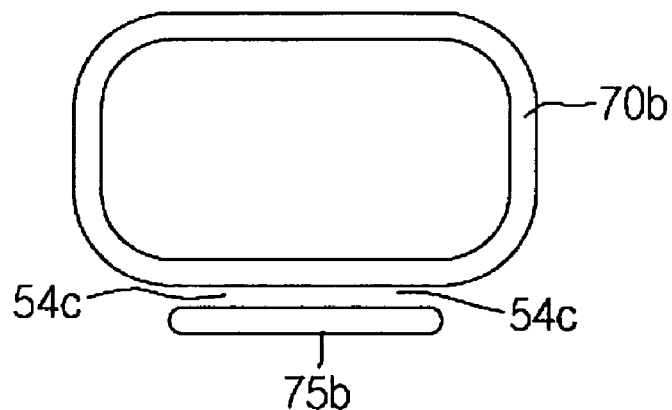

In accordance with the present invention, various solder sealing structure configurations disclosed herein may be suitably combined where appropriate for the intended application. Another exemplary embodiment thus combining configurational features such as those described in preceding paragraphs is illustrated in FIGS. 18a and 18b. One of the solder sealing ring pad configurations 50 and 70b may be formed on the image sensor die while the other may be formed on the corresponding substrate. Further explanation is omitted in the interests of brevity and clarity.

The air vent provided by the solder sealing ring structure formed in accordance with one aspect of the present invention enables the venting necessary during fabrication of the electronic package with minimal exposure to the entry of particles into the package's contamination-sensitive area(s). However, additional sealing measure may be desirable to block the air vent and further mitigate the likelihood of particle entry and humidity uptake into the image sensing area. Toward such ends, polymer sealing measures, at least blocking the air vent area, may also be employed in a preferred embodiment of the electronic package. A notable advantage of an electronic package formed in accordance with the present invention is that the solder sealing ring structure simply and easily accommodates such additional polymer sealing.

For better understanding, it is helpful to consider the practical difficulties in forming a polymer structure without such features as the solder sealing ring structure of the present invention. Generally, epoxy or the like is applied about the sealing area by dispensing. If an ordinary low viscosity underfill material is used, the material will tend very easily to flow inside due to surface tension. Since this kind of material flows very easily and very quickly over several millimeters, it would surely cover at least some of the image sensing area, which of course must be kept clean for proper operation. For this reason, high viscosity polymer material is generally more suitable for image sensing applications. Still, even high viscosity polymer materials present considerable likelihood of contaminating the image sensing area, as image sensing area is typically formed to remain in close proximity to an edge of the image senor die. Adequately dispensing such high viscosity polymer material also presents practical challenges that may not be encountered with normal low viscosity underfill material, rendering the process more costly, prohibitively so in some cases.

The inclusion of a solder sealing ring structure having an air vent as disclosed herein permits, among other things, ordinary low viscosity polymer material to be safely used for added sealing. The applied polymer material may tend to flow, as usual, due to surface tension. As it flows about the solder sealing ring structure to fill and block the structure's air vent; however, its further migration actually into the cavity encircled by the solder sealing ring structure is effectively halted by the pressure of the air which becomes naturally entrapped therein.

A point of practical note is that the degree of such natural resistance to the polymer material's migratory flow into the sealing ring structure cavity may vary with the actual choice of configurational features incorporated in the sealing ring structure. For instance, the solder sealing ring structure formed using the solder sealing ring pad configurations shown in FIGS. 10a and 10b provides no barrier between the air vent and image sensing area. While entrapped air's pressure will, macroscopically, resist the polymer material flow's entry inside, some amount of resin-bleed encroachment may occur due to surface tension, microscopically, into the cavity. The solder sealing ring structure formed using the solder sealing ring pad configurations comparable to those shown in FIGS. 12a and 12b may be preferable in this regard. Such solder sealing ring structure would provide a longer path of travel for a migratory flow to actually reach the image sensing area disposed in the cavity.

Figure 1:
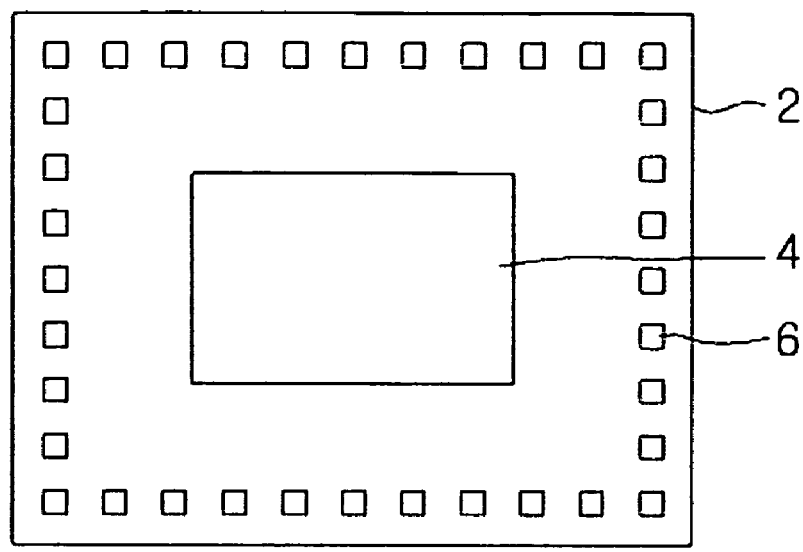
FIG. 1 is a schematic diagram of a prior art image sensor die layout.
Figure 2:
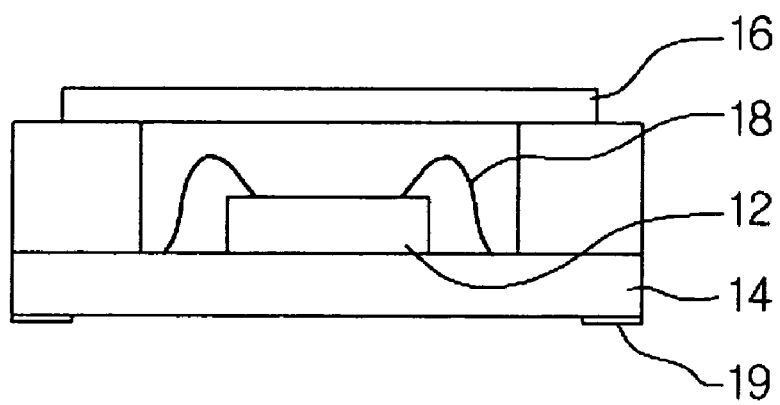
FIG. 2 is a schematic cross-sectional view of a prior art electronic package for an image sensor.
Figure 3:
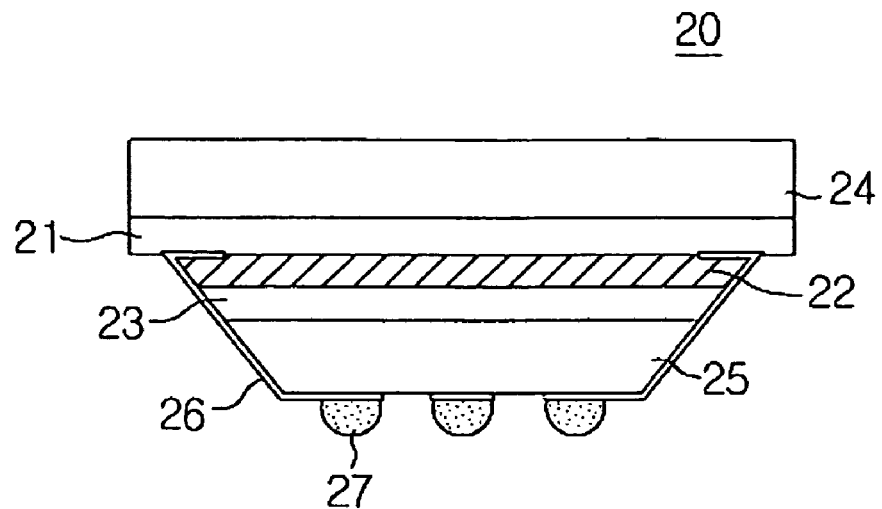
FIG. 3 is a schematic cross-sectional view of another prior art electronic package for an image sensor.
Figure 4A:
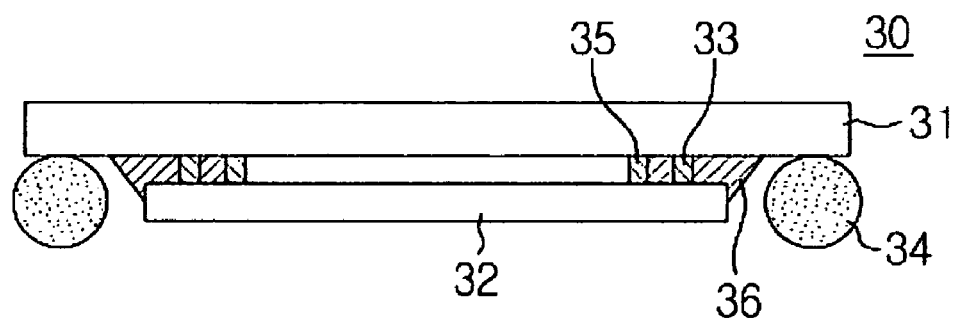
FIG. 4a is a schematic cross-sectional view of another prior art electronic package for an image sensor.
Figure 4B:
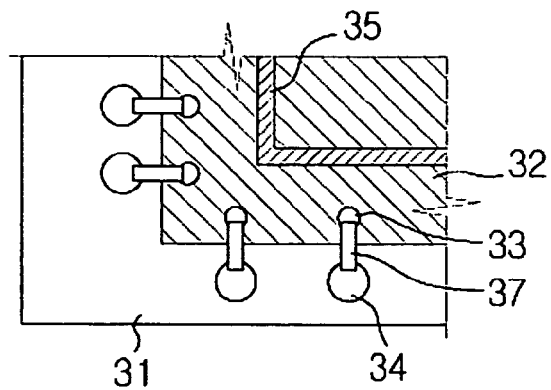

Another point of practical note is that the sealing structure of the present invention yield substantially better sealing performance than such other prevalent electronic packages as ceramic packages shown in FIG. 2. In typical ceramic packages, an epoxy sealing structure is disposed between a ceramic substrate and a glass lid along the entire periphery of the package. An electronic package formed in accordance with the present invention may, in contrast, include a polymer seal which need only be disposed at a certain air vent area. Since humidity uptake may occur primarily through the polymer sealing portion in both structures, the degree of humidity uptake permitted by the structure depends largely on the actual area of the polymer sealing portion employed. This polymer sealing portion is, of course, considerably less in the electronic package of the present invention. Its overall sealing performance is therefore expected to exceed that of the ceramic package.

In terms of humidity uptake, the full hermetic sealing approach employed in the IMEC, VZW package will ideally yield the best results, but such results are gotten with this approach only at the expense of adequate measures to overcome such critical difficulties in fabrication, for instance, as discussed in preceding paragraphs. An electronic package formed in accordance with the embodiment of the present invention just described very closely approaches the hermetically sealed package in sealing performance, employing as it does non-hermetic polymer sealing only at a small area (air vent) and hermetic sealing at the other surrounding areas.

Figure 19A:
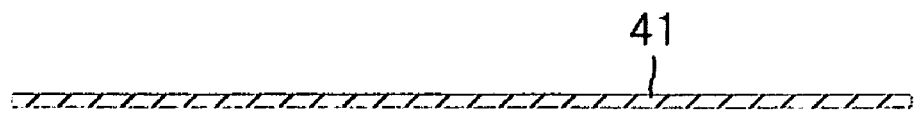
FIGS. 19a-19c are a series of schematic cross-sectional views incrementally illustrating flip chip bumping upon an image sensor wafer in accordance with an exemplary embodiment of the present invention.
Figure 19B:
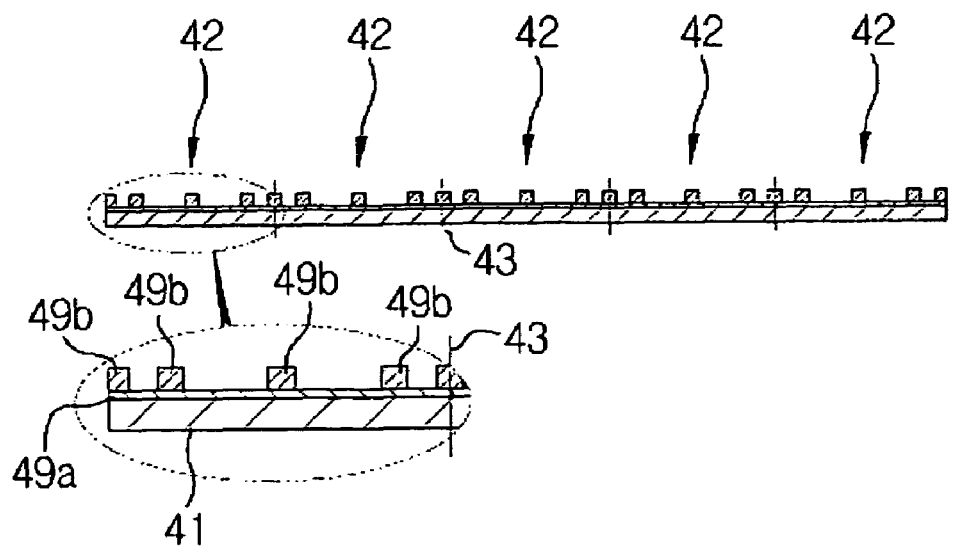
Figure 19C:
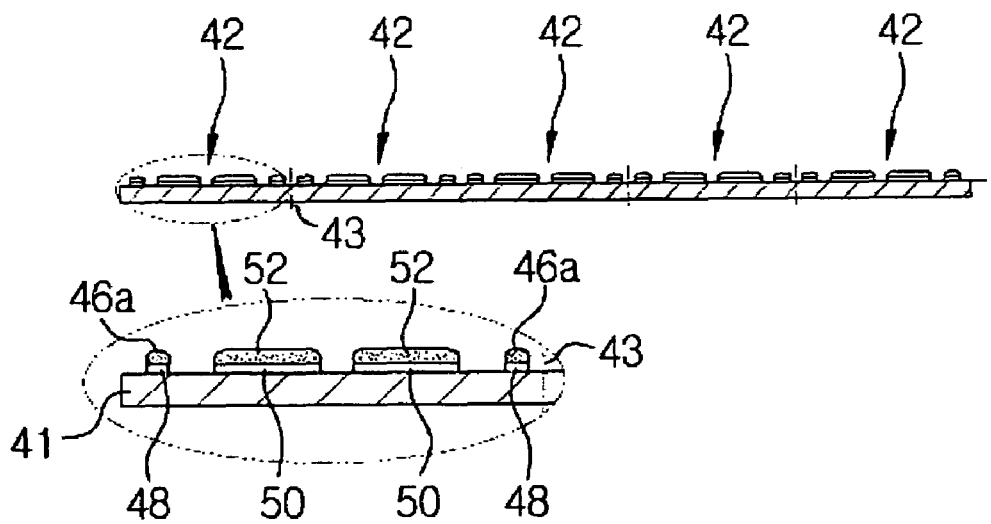
Figure 20A:
FIG. 20a-20f are a series of schematic cross-sectional views incrementally illustrating substrate fabrication and flip chip assembly thereon of image sensor dies formed as shown in FIGS. 19a-19c, in accordance with an exemplary embodiment of the present invention; and, FIG. 21 is a schematic cross-sectional view of an exemplary embodiment of an electronic package formed in accordance with the embodiment of the present invention illustrated in FIGS. 20a-20f, shown assembled on a printed circuit board (PCB).
Figure 20B:
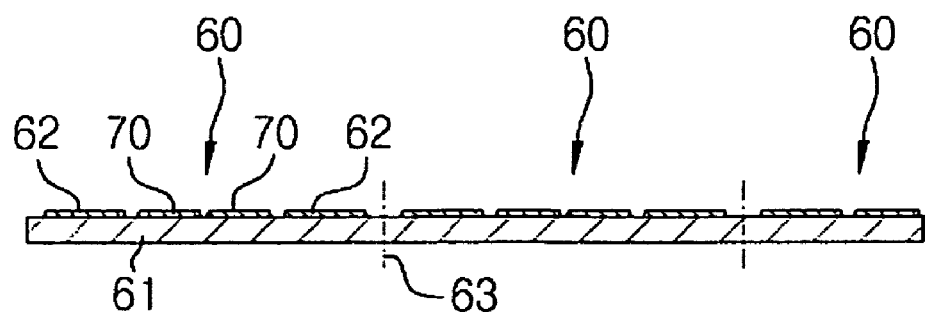
Figure 20C:
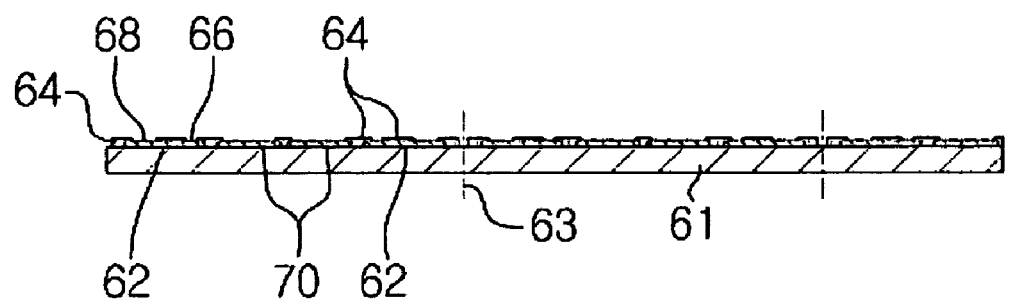
Figure 20D:
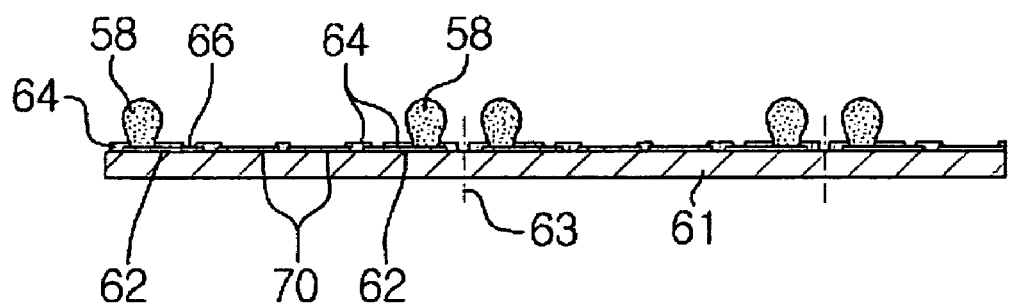
Figure 20E:
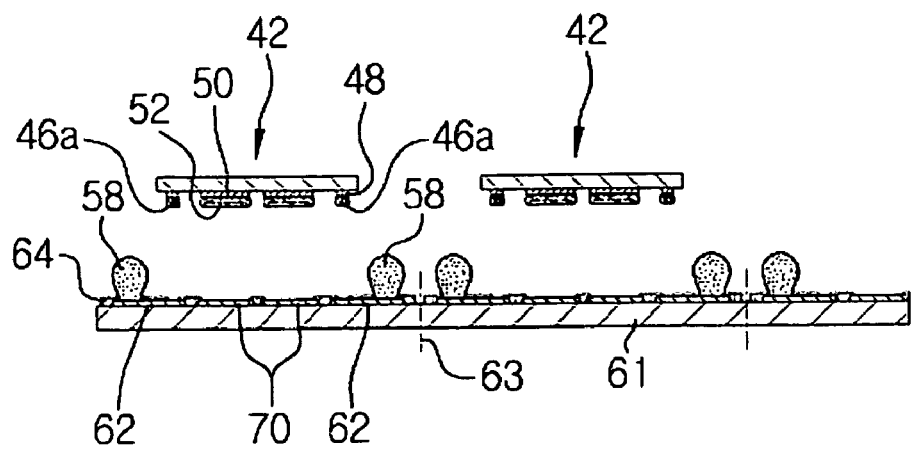
Figure 20F:
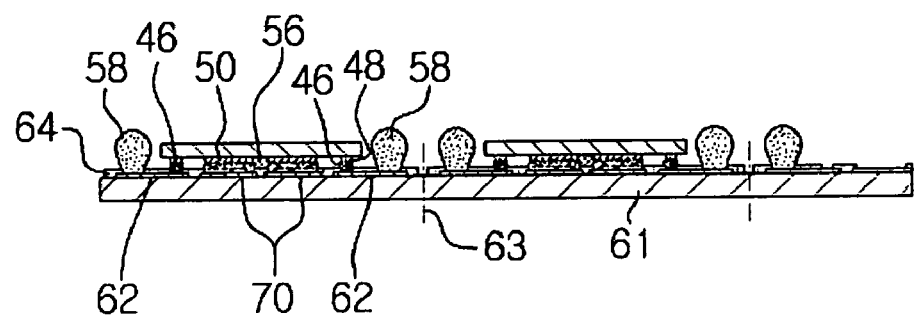

FIGS. 19a-19c and 20a-20f show a series of schematic cross-sectional views of an image sensor and substrate wafer of an electronic package at different stages of fabrication, in accordance with one exemplary embodiment of the present invention. The process steps for forming an electronic package of the present invention generally include solder bumping of an image sensor wafer to form one or more image sensor dice 42, as shown in FIGS. 19a-19c; substrate fabrication, as shown in FIGS. 20a-20d; and, assembly of each image sensor die 42 and unit substrate 60, as shown in FIGS. 20e-20f. These views are taken along much the same cross-sectional line C of the device referenced in FIGS. 5a and 5b.

In forming an exemplary electronic package in accordance with the present invention, an image-sensing semiconductor wafer 41 is typically provided with a plurality of dice, each die 42 having integrated circuitry formed on a front surface of the wafer, with a plurality of bonding pads. The wafer has formed over its front surface a patterned passivation layer for protecting the integrated circuitry underneath. Openings are provided accordingly in the patterned passivation layer at the bonding pads. Each of the resulting image-sensing dice defines at least one image sensing area at its fronts or light receiving, surface.

Wafer bumping is a well-known technique that has been used for many years since the initial teaching of U.S. Pat. No. 3,292,240 "Method of Fabricating Microminiature Functional Components" assigned to IBM. Many bump materials are known in the art. They include Gold, Nickel, Copper, and solder alloys. Some of these are applicable for forming the electronic package in the present invention but in the embodiment described in following paragraphs, a solder bump is preferably employed.

A typical wafer solder bumping process includes forming at least one patterned metal layer for making flip chip bump pad connections to the bonding pads on the wafer. Metallurgy used for flip chip solder bump pads may be the so-called under bump metallurgy (UBM), and typically utilizes a multilayered structure to provide multiple properties, such as good adhesion to the bonding pad, good diffusion barrier function against the solder bump material, good wettability for the given solder material, and good protection from oxidation.

There are several UBM systems for forming flip chip solder bump pads 48 that have been used for many years in the art. These include TiW/Cu, Al/NiV/Cu, and Electroless Ni/Immersion Au. Detailed explanation is omitted for clarity and brevity, as the availability of typical UBM systems, the compositions of the metal layers, and the corresponding layer thicknesses are among those things well-known to persons versed in the flip chip solder bumping art.

One departure in the present invention from conventional flip chip solder bumping is the additional formation of solder sealing ring pads 50, 70. They are formed in addition to the flip chip solder bump pads formed in the resulting electronic package.

Generally, a flip chip solder bump pad 48 having a circular or rectangular shape is directly formed on bonding pads. In rectangular shape, the corners are smoothly configured. The size is determined for each pad to preserve sufficient distance from adjacent pads. If the distance is not enough, flip chip solder bump pads are relocated, in a "re-distribution" process, from the original bonding pads to positions whereby the resulting solder bump pads will have sufficient space in-between. The solder bump pad size (diameter in the case of circular shape and the length of the short and long edges in the case of a rectangular shape) may be 80-150 micrometers in a preferred embodiment, though it is not limited thereto. Typical design rules used in forming flip chip solder bump pads are well-known to persons versed to flip chip bumping art, and for that reason not further elaborated herein.

The solder sealing ring pad 50 was described in preceding paragraphs, and not further described here. Turning to the material composition of the solder preferably employed, solder is a common interconnection material used in the electronic packaging art. Generally, the primary elements of solder are tin (Sn) and lead (Pb). Solder having more than 70% Pb (and the rest primarily Sn) is commonly referred to as high-lead solder. This type of solder exhibits relatively high melting temperature, and finds use in applications requiring high temperature reliability (stability).

The most common solder material contains about 63% Sn, the rest being primarily Pb. It is commonly referred to as eutectic solder because its composition is about the eutectic composition of an Sn—Pb binary alloy system. This material tends to exhibit the lowest of melting temperatures, or about 183° C.

As the industry moves to lead-free solder in light of environmental concerns, lead-free solder will likely replace the eutectic solder as the material of choice very soon. This material is normally based on Sn, with a few percentage or less composition of Cu and/or Ag. Its melting temperature ranges between approximately 205° C.-210° C., a little higher than that of eutectic solder. In accordance with the present invention, any suitable solder material known in the art may be used, depending on the requirements and preferences in the intended application.

There are many techniques known in the art usable for forming flip chip solder bump pads and solder sealing ring pad, such as sputtering, electroplating, electro-less plating, or the like. Many techniques are also known for forming solder bumps over the solder bump pads and solder sealing ring pads. These include electroplating, printing, and the like.

The present invention is not limited to any specific techniques for forming solder bump pads or solder bumps. However, electroplating will be taken as an example below.

In accordance with one aspect of the present invention, a solder sealing ring pad and solder bumping over the pad are formed in addition to the flip chip bump pads and solder bumps over the pads. Preferably, though not necessarily, UBM pads and solder bumps over the pads may be formed using an electroplating technique. In this technique, as shown in FIGS. 19a-19c, one or more metal layers, such as a so-called "seed layer" 49a, are deposited over an image sensor wafer 41 by sputtering. Typical metal layers used in this technique preferably though not necessarily include a TiW layer of approximately 1,000-3,000 A in thickness, and a copper layer of approximately 2,000-10,000 A in thickness over the TiW layer.

A suitable photo-resist (PR) material is coated over the wafer by spin coating or the like. The thickness of this PR material may preferably though not necessarily be approximately 20-80 micrometers. A patterned PR layer 49b is formed by photolithographic technique as shown in FIG. 19b. Copper (Cu) and Sn (or Sn—Ag alloy) layers may be grown over the exposed area if lead-free solder bumps are to be formed. The thickness of the Cu layer may be approximately 2-20 micrometers and that of the Sn (or Sn—Ag alloy) layer may be approximately 20-80 micrometers in such application. Thereafter, the patterned PR layer 49b is removed by a standard semiconductor process, such as "PR striping," and the seed layer 49a is removed by metal etching. The wafer is then subjected to a solder reflow process. The cross-sectional view of the resulting image sensor wafer having flip chip solder bump pads 48, solder sealing ring pad 50, flip chip solder bumps 46a, and solder sealing ring 52, is shown in FIG. 19c. The height of the solder bumps for flip chip bumps and also for the solder sealing ring may preferably though not necessarily be approximately 40-120 micrometers.

Both sides of solder joints, at the image sensor and substrate, are preferably formed with flip chip solder bump pads as well as solder sealing ring pads in an exemplary embodiment of the electronic package of the present invention. However, solder bumps may be formed on either or both of the two sides. The exemplary embodiment described above illustrates the case wherein the solder bumps are formed on the image sensor side.

A substrate 61 may be fabricated separately. This substrate is preferably disposed, initially, in wafer or panel form having a large area to form a plurality of unit substrates 60 in a batch process, in much the same manner as the semiconductor wafer is formed with a plurality of dice fabricated thereon. Generally, the substrate material preferably includes sufficient degrees of: transparency, mechanical rigidity, and chemical stability—as required by the intended application.

The substrate material must possess not only sufficient chemical resistance and mechanical stability to withstand the temperature and processing extremes to which it would be subjected during the necessary fabrication steps, but also sufficient resistance to expected environmental factors to support the resulting devices' expected service life.

A preferable substrate material for image sensor operating in the visible range of wavelengths is any suitable glass material known in the art to be adapted for optical applications. Such glass materials tend to possess suitable degrees of chemical and temperature stability, and to be readily available at reasonable cost, and from many sources.

Depending on the requirements of the intended application, the substrate may be coated with at least one thin film layer on one or more of its surfaces to enhance the light transmission therethrough. Such coating may be of the so-called anti-reflection coating (ARC) type well known to persons versed in the optical art, which serves to minimize the reflection loss of light over the entire spectrum of interest. Similarly, the substrate may be coated with at least one thin film layer on one or more of its surfaces to enhance or reduce the transmission therethrough of light at a specific range of wavelengths. Such coatings are of the "optical filtering" type also known in the art of optics. One example is an infrared (IR) cut filter coating used in much the same manner an IR cut filter glass is used for a cellular phone camera module.

At least one patterned metal layer 62 is formed on the front surface of the substrate 61 for making electrical interconnection lines. Then at least one patterned passivation layer 64 is formed on the patterned metal layer for protecting the interconnection lines defined thereby. This patterned passivation layer is formed with openings for making bonding pads at the substrate side. These bonding pads enable interconnections to be made between the interconnection lines of the substrate and the image sensor, external systems, the solder sealing ring, and other components, if any.

This patterned metal layer may be formed by any suitable semiconductor fabrication process known in the art. For instance, it can be formed by a series of processes, such as depositing a metal layer by sputtering, coating a PR by spin coating, patterning the PR layer using a photolithographic process with expose and develop steps, removing a portion of the resulting metal layer by metal etching, and removing the PR by striping. A patterned passivation layer may likewise be formed by any suitable fabrication process known in the art.

Instead of using inorganic passivation material such as silicon oxide or silicon oxide/nitride, a polymer passivation material may be more suitable for the electronic package of the present invention, in terms of fabrication cost and enhanced reliability. There are many polymer materials commercially available for this application, such as CRC 8600 supplied by Sumitomo Bakelite, Japan, a positive photo-sensitive material. A patterned passivation layer using such material may be formed by a series of processes, including for instance coating the polymer passivation material by spin-coating, patterning the layer using a photolithographic process with expose and develop steps, and curing. Typical thicknesses of the resulting polymer passivation layer preferably range about 5 micrometers, but may be anywhere within approximately 3-20 micrometers, if necessary.

In accordance with the present invention, the substrate may preferably, though not necessarily, further include UBM pads formed over the bonding pads if the bonding pads themselves are not sufficiently suitable for forming solder joints. Also in accordance with the present invention, the substrate may, though not necessarily, further include flip chip solder-bumps and solder sealing ring formed over the UBM pads.

In the present invention, the size of flip chip solder bump pad 66 opening and solder sealing ring pad 70 opening may be determined suitably for convenience. The flip chip solder bump pad opening may be formed with a circular or rectangular shape corresponding to that on the image sensor die. The diameter, in the case of a circular shape, or the length of the short or long edge, in case of a rectangular shape, may be approximately 80-150 micrometers. The solder sealing ring pad 70 opening width may be approximately 60-200 micrometers, much as with the image sensor die.

In accordance with the present invention, the shape of the external pad 68 opening may be circular, rectangular, or of another suitable shape, if necessary. The electronic package embodiment illustrated in FIG. 7 or 8 are shown with circular shaped pad openings, while that illustrated in FIGS. 9a and 9b are shown with rectangular shaped pad openings. Greater size and spacing would be preferable for heightening solder joint reliability. Preferably though not necessarily, the pad size may be greater than 300 micrometers and the space between neighboring pads may be greater than 200 micrometers.

The electronic package shown in FIG. 7 includes solder balls 58 attached to the external terminals 68. This structure may be formed by a so-called wafer level ball mounting process. This process includes application of flux on the external terminals by using screen-printing or the like and placing solder balls on these external terminals having flux thereon. The substrate is then solder-reflowed at solder reflow oven, whereby the solder balls melt and wet onto the external terminals. In order for this to occur properly, the external terminals require the same UBM as the flip chip solder bump pads or solder sealing ring pad. Proper cleaning follows after reflow for removing any flux residue, if necessary. These processes are well-known to persons versed in semiconductor packaging art.

Then, assembly of the image sensor die and substrate follows. First, the image sensor wafer 41 needs to be diced to separate each image sensor die 42 through the dicing lines 43 by means of a suitable semiconductor wafer sawing process known in the art. The image sensor die may thereafter be assembled on the substrate by means of a standard flip chip mounting process well-known process to persons versed in flip chip assembly art. This process typically includes pick, flip, and place motions sequentially. Flux application at the necessary flip chip joining areas is typically included.

One common technique is commonly referred to as "dipping." In this technique, the image sensor die is placed onto a flux table holding a thin layer of flux, before it is placed onto the substrate The image sensor die and substrate assembly is heated above the melting temperature ox the given solder material so that the solder bump and solder sealing ring can melt and wet onto the pads. This solder reflow process is typically carried our using a belt oven.

Flip chip solder joints 46 are formed as a result of this process between the flip chip solder bump pads 48 and 66 on the image sensor and substrate, respectively. At the same time, solder the sealing ring 52 is formed between the solder sealing ring pads 50 and 70 on the image sensor and substrate, respectively. An air vent structure 54 remains on the solder sealing ring 52 in accordance with the present invention. As mentioned before, this air vent structure 54 provides a path by which air may evacuate when the solder sealing ring is formed with collapse. Preferably, the air vent structure is determined by the solder sealing ring pad structure. Various configurations are illustrated in FIGS. 10-18 as described in preceding paragraphs.

The electronic package embodiment shown in FIGS. 6a-6b includes a polymer sealing structure 56 blocking the air vent 54. This polymer sealing structure may be formed be formed by any suitable means known in the art. For example, it may be formed by dispensing an epoxy material or the like. Two types of dispensing techniques are generally employed. One is needle dispensing and the other jet dispensing. While jet dispensing may be the more preferable in terms of productivity, dispensing processes are a well-known techniques to persons versed in the electronic packaging art, and further detailed explanation of such is omitted in the interests of brevity and clarity.

The substrate may include a key mark for use by the dispensing equipment in determining dispensing position, so as to enhance positional accuracy and productivity. Curing follows after dispensing for hardening the polymer structure.

Then the substrate is diced to separate each unit substrate and complete the electronic package embodiment 40 of the present invention.

Figure 21:
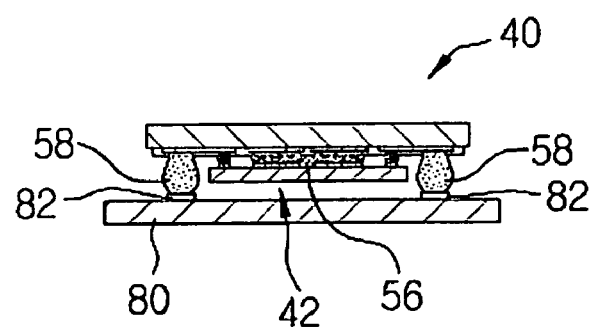

FIG. 21 illustrates an electronic package realized in an exemplary embodiment of the present invention illustratively assembled on external system such as PCB 80 of digital camera. In such application, the electronic package of the present invention may be used for a CCD or CMOS image sensor, for example. The electronic package of the present invention may be used with such other photo-sensors as a line sensor or a point sensor, in addition to image sensor. In the same sense, the electronic package of the present invention may be used with image sensors of various suitable types, such as an X-ray sensor or an IR sensor having sensitivities in ranges of wavelength other than that of visible light. Also, the electronic package of the present invention may be used for various other semiconductor devices requiring substantial cavity enclosure. A typical application is in MEMS devices.

Although this invention has been described in connection with specific forms and embodiments thereof, it will be appreciated that various modification other than those discussed above may be resorted to without departing form the spirit or scope of the invention. For example, equivalent elements may be substituted for those specifically shown or described, certain features may be used independently of other features, and in certain cases, particular combinations of fabrication or assembly steps may be reversed or interposed, all without departing from the spirit or scope of the invention as defined in the appended Claims.

What is claimed is:

1. A method of fabricating a semiconductor device package comprising the steps of:
    (a) establishing a semiconductor die having a sealing area defined on a front side thereof;
    (b) establishing a substrate having a front surface;
    (c) forming respectively on said semiconductor die and said substrate first and second solder sealing ring pads, said first and second solder sealing ring pads being substantially aligned one relative to the other, at least one of said first and second solder sealing ring pads defining an open loop contour; and,
    (d) flip chip mounting said semiconductor die on said substrate to form a solder sealing ring structure sandwiched between said first and second solder sealing pads of said substrate and semiconductor die, said solder sealing ring structure extending peripherally about a substantial portion of said sealing area to substantially enclose thereat a cavity between said semiconductor die and said substrate, said solder sealing ring structure including at least one venting portion defining against at least one of said substrate and semiconductor die an air vent in open communication with said cavity.

2. The method as recited in claim 1, further comprising before step (d) the steps of:
    (1) forming a plurality of flip chip solder bump pads connecting electrical terminals formed on said semiconductor die and said solder sealing ring pads;
    (2) forming a plurality of solder bumps over said flip chip solder bump pads and one of said first and second solder sealing ring pads on said semiconductor die;
    (3) forming at least one patterned metal layer on said substrate; and,
    (4) forming at least one patterned passivation layer on said patterned metal layer of said substrate.

3. The method as recited in claim 2, wherein step (d) further includes the step of forming a plurality of flip chip solder joints to connect said flip chip solder bump pads on said semiconductor die to respective flip chip bump pads defined on said substrate by said patterned metal and passivation layers.

4. The method as recited in claim 1, further comprising the step of forming a polymer sealing structure between said semiconductor die and said substrate adjacent said air vent, said polymer sealing structure substantially blocking said air vent.

5. The method as recited in claim 1, further comprising before step (d) the step of forming a plurality of solder balls on said substrate.

* * * * *